United States Patent [19]

Hariri

[11] Patent Number: 5,004,519

[45] Date of Patent: Apr. 2, 1991

[54] RADIATION HEAT SHIELD FOR SILICON MELT-IN MANUFACTURING OF SINGLE CRYSTAL SILICON

[75] Inventor: Farouk A. Hariri, Sherman, Tex.

[73] Assignee: Texas Instruments Incorporated, Dallas, Tex.

[21] Appl. No.: 244,623

[22] Filed: Sep. 12, 1988

Related U.S. Application Data

[63] Continuation of Ser. No. 941,008, Dec. 12, 1986, abandoned.

[51] Int. Cl.[5] .................. C30B 15/00; C30B 35/00
[52] U.S. Cl. .................. 156/620.4; 422/249; 266/242
[58] Field of Search .................. 156/608, 617.1, 618.1, 156/619.1, 620.1, 620.2, 620.3, 620.4, 620.5; 422/246, 248, 249; 266/262, 242; 432/42, 56, 65, 226, 245, 249, 250, 254.1, 262

[56] References Cited

U.S. PATENT DOCUMENTS

| | | | |
|---|---|---|---|
| 3,511,610 | 5/1970 | Dohmen et al. | 422/249 |
| 4,330,362 | 5/1982 | Zulehner | 156/617 SP |
| 4,378,269 | 3/1983 | Matsushita et al. | 156/617 SP |
| 4,402,786 | 9/1983 | Little | 156/608 |
| 4,406,731 | 9/1983 | Chartier | 156/617 SP |
| 4,440,728 | 4/1984 | Stormont et al. | 422/246 |
| 4,544,528 | 10/1985 | Stormont et al. | 422/246 |

FOREIGN PATENT DOCUMENTS 1091093  5/1986  Japan ........................ 422/249

*Primary Examiner*—John Doll
*Assistant Examiner*—R. Bruce Breneman
*Attorney, Agent, or Firm*—Gary C. Honeycutt; Melvin Sharp; N. Rhys Merrett

[57] ABSTRACT

The disclosure relates to a radiation heat shield which is formed of graphite which covers the open end of the crucible of a furnace for forming single crystals of silicon by the Czochralski method. The graphite preferably has a silicon carbide coating thereon. The heat shield is preferably formed in plural segments with a counterweight at one end of each of the segments whereby, upon raising of the crucible, the segments and associated counterweight rotate about a pivot to expose the top of the crucible.

11 Claims, 2 Drawing Sheets

RADIATION HEAT SHIELD FOR SILICON MELT-IN MANUFACTURING OF SINGLE CRYSTAL SILICON

This application is a Continuation of application Ser. No. 941,008, filed Dec. 12, 1986, now abandoned.

BACKGROUND OF THE INVENTION

1. Field of the Invention

This invention relates to crucibles used in furnaces for formation of single crystal silicon by the Czochralski method and, more specifically, to a flip top cover therefor which acts as a radiation heat shield.

2. Brief Description of the Prior Art

Prior art crucibles for use in furnaces for melting of polycrystalline silicon (polysilicon) therein and then pulling a single crystal of silicon therefrom by the Czochralski method and the like have generally included a graphite crucible exterior with a quartz liner on the interior thereof. The crucible is situated within a stainless steel enclosure with a graphite heater positioned between the crucible and the stainless steel enclosure. In practice, polycrystalline silicon of semiconductor grade or the like are melted in the crucible and a seed crystal, at the end of a rod, is then placed in the melt and extracted therefrom slowly under standard known conditions to form the single crystal of silicon from which wafers are later formed.

Several problems that have existed with such prior art furnaces and crucibles used therein are, first, that the polysilicon, when melted for later growth of the single crystal, loses much of the energy therein by radiation above the melt, thereby requiring a relatively large amount of power for melting the polysilicon in the crucible. Second, since the heat travels slowly through the melt from the heaters exterior to the crucible, the top of the melt, which is exposed to the furnace atmosphere, permits any oxides which are generated to reside on the melt surface, these oxides being vaporized off only by addition of a greater amount of energy to the melt. The increase in energy fed to the melt, in turn, causes an increase in reactivity between the silicon and the quartz liner of the crucible to increase the amount of oxygen in the melt. The increase of heat to the melt also causes impurities to be generated from the graphite which impurities enter the melt and ultimately enter the crystal. This increase in heat also causes impurities, such as aluminum, to enter the silicon melt due to degeneration of the quartz liner. In addition, the increased heat causes the quartz liner in the crucible to sag, thereby causing non-symmetrical heat distribution in the melt and causing single crystal growth to be more difficult.

SUMMARY OF THE INVENTION

In accordance with the present invention, the above described problems of the prior art are overcome and there is provided a furnace with a crucible therein wherein total energy required for melting of the polysilicon is greatly diminished and the time required for melting of the polysilicon starting materials in the crucible is also greatly diminished. For example, melts requiring 80 to 95 KW for 165 to 195 minutes using the prior art furnace and crucible can now be produced using 60 KW for 130 to 150 minutes.

In accordance with the present invention, there is provided a furnace for formation of a single crystal of silicon from a polycrystalline silicon melt by the Czochralski method or the like, wherein a graphite radiation heat shield having a silicon carbide coating thereon is provided over the melt to prevent heat within the crucible from being radiated outwardly therefrom. The radiation shield also has the property of reflecting heat back into the melt, thereby substantially increasing the amount of heat at the melt surface, whereby oxides and the like forming on the melt surface are rapidly vaporized and gases formed, such as carbon monoxide and carbon dioxide are diverted away from the melt surface into the furnace exhaust system. Essentially the carbon level in the melt is reduced. Furthermore, the radiation heat shield also prevents the quartz liner in the crucible from sagging and providing the non-symmetrical heat distribution in the melt as found in the prior art furnaces.

Briefly, the furnace comprises a housing, preferably stainless steel as in the prior art, with a graphite heater and crucible as in the prior art. The crucible is movable vertically toward the removable top of the furnace. A system of several reflector plates, four such plates being used in the preferred embodiment, are positioned so that they can cover the top of the crucible, each reflector plate having a counterweight thereon at one edge thereof whereby movement of the counterweight in a direction away from the crucible causes the reflector plate attached thereto to swing upwardly and expose the crucible surface. The counterweights are preferably formed of graphite to minimize the possibility of impurities entering the melt, though other materials can be used, depending upon the problems that may be caused by impurities therein. The reflector plates are also formed of graphite and preferably have a silicon carbide coating thereon. This coating will form, in any event, from the reaction of silicon emanating from the melt with the graphite after only a few hours of use. In the preferred embodiment, a felt formed of graphite fiber is disposed between a pair of graphite plates to form the reflector shield.

In actual operation, the semiconductor grade silicon is placed in the crucible, the reflector plates are positioned to cover the top of the crucible and heat is applied from the heater until the silicon has melted. The crucible is then lifted vertically to lift the reflector plates and cause the counterweights thereon to rotate until their center of gravity relative to a pivot carrying the plate and counterweight causes the reflector plates to rotate to a vertical position. With the top of the crucible now open to the furnace atmosphere and heat still being applied to maintain the melt, a seed crystal is placed into the melt and pulled away from the melt in known manner to form a single crystal of semiconductor grade silicon.

DESCRIPTION OF THE PREFERRED EMBODIMENT

Figure 1:
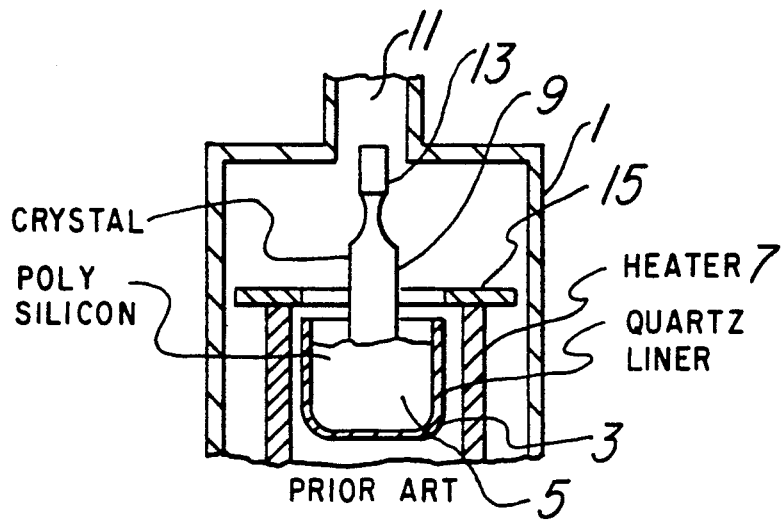
FIG. 1 is a cross-sectional view of a furnace with crucible for forming single crystals of silicon in accordance with the prior art.

Referring first to FIG. 1, there is shown a prior art furnace with a crucible 3 for use in melting of polycrystalline silicon (polysilicon) 5 therein and then pulling a single crystal of silicon 9 therefrom by the Czochralski method and the like. Such furnaces have generally included a graphite crucible exterior with a quartz liner on the interior surface thereof. The crucible 3 is situated within a removable top 11 stainless steel enclosure 1 with a graphite heater 7 positioned between the crucible and the enclosure. In practice, polycrystalline silicon of semiconductor grade or the like 5 are melted in the crucible 3 and a seed crystal 9, held in a chuck 13, is then placed in the melt and extracted therefrom slowly under standard known conditions to form the single crystal of silicon from which wafers are later formed. The problems inherent in this prior art system are enumerated hereinabove.

The furnace of FIG. 1 is improved, in accordance with the present invention, as set forth in FIGS. 2 to 5, by placing a radiation heat shield on the ledge 15 over the heater 7 of FIG. 1 or by other equivalent structure whereby heat generated within the crucible is substantially retained therein and reflected back to the melt surface therein.

Figure 2:
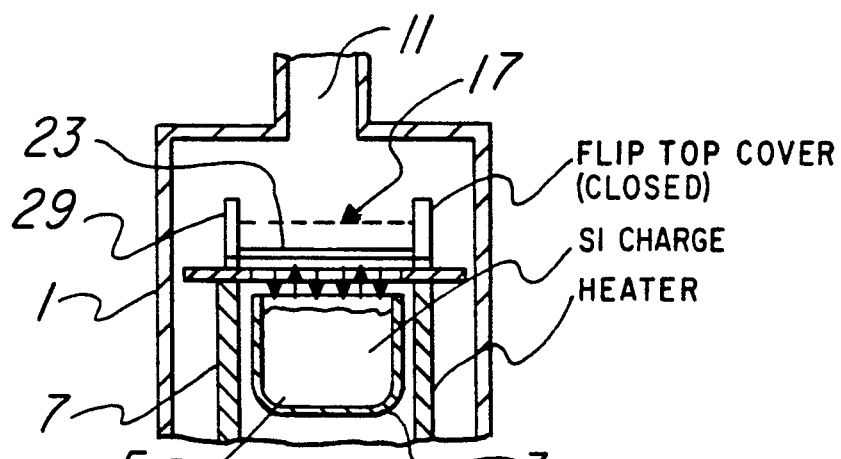
FIG. 2 is a cross-sectional view of a furnace with crucible in the closed position in accordance with the present invention.
Figure 3:
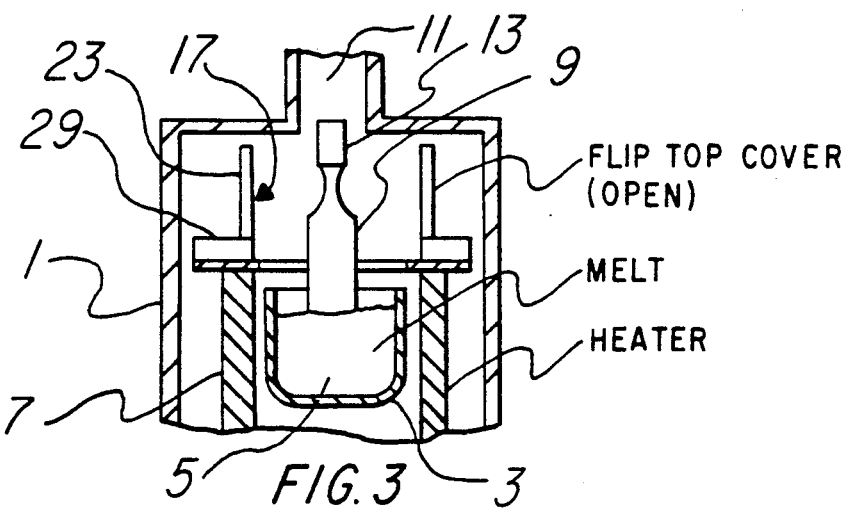
FIG. 3 is a cross-sectional view of a furnace with crucible in the open position in accordance with the present invention.
Figure 4:
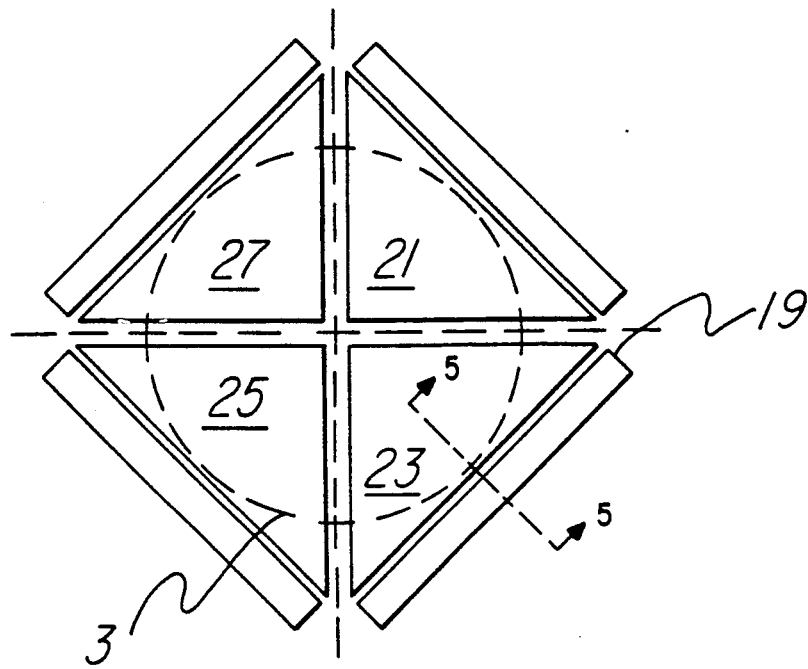
FIG. 4 is a top view of the crucible and radiation heat shield in accordance with the present invention.
Figure 5:
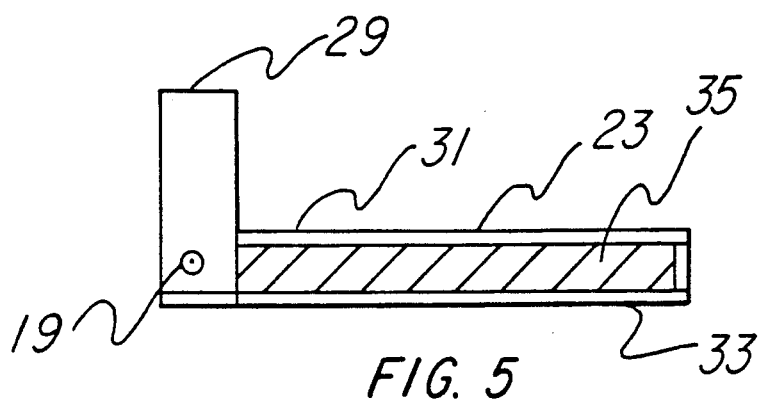
FIG. 5 is a view taken along the line 5—5 of FIG. 4.

With reference to FIGS. 2 to 5, wherein like reference characters indicate the same or similar structures as described with respect to FIG. 1, there is shown the improvement, both in the closed position in FIG. 2 and in the open position in FIG. 3. The housing 1 with removable top 11, crucible 3, melt 5 and heater 7 are the same as in the prior art. However a radiation heat shield 17 is positioned over the crucible. The heat shield 17 is composed of a plurality of segments 21, 23, 25 and 27, four such segments being shown in FIG. 4, and operates as a cover over the crucible 3 and is pivotable about a pivot 19 (FIGS. 4 and 5). It should be understood that the heat shield can be composed of any number of segments, from one up, the only reason for having plural segments being so that the crucible cover can be easily lifted.

Each of the heat shield segments 21, 23, 25 and 27 includes a counterweight 29 through which the pivot 19 passes. Though the pivot is shown passing through counterweight 29, it should be understood that the pivot can be positioned anywhere on the counterweight or the bottom portion of a segment, the only criterion being that the segment 23 of FIG. 5 be capable of normally resting over the crucible when the counterweight is in a first predetermined position on the pivot and capable of normally resting in a second position not over the crucible when the counterweight is in a second predetermined position. Secured to the counterweight is the radiation shield segment 23 which is substantially the same as the other segments 21, 25 and 27. The segment 23 includes an upper layer of graphite 31, a lower layer of graphite 33 and a layer of graphite fiber felt 35 sandwiched between the graphite layers. The outer surfaces of the graphite layers 31 and 33 can be optionally coated with silicon carbide, though such a layer will normally form from a few hours of use by the impingement of elemental silicon from the melt onto the graphite layers, forming the silicon carbide.

In operation, with reference to FIG. 2, semiconductor grade polysilicon is placed into the crucible 3, the heat shield segments 21, 23, 25 and 27 are rotated so that they cover the crucible with the counterweights 29 being rotated about their respective pivots 19 so that the segments remain in fixed position covering the crucible top. The heater 7 is than turned on and heats up the silicon whereby it becomes a melt in standard manner. The crucible 3 is then moved up in a vertical direction whereby the segments 21, 23, 25 and 27 are rotated about the pivot 19 whereby the counterweights 29 are rotated to the position shown in FIG. 3, opening up the top of the crucible. A seed crystal 9 is then passed through the removable top 11 of the enclosure 1 and into the melt 5, making contact therewith and then slowly pulling a crystal 9 therefrom in standard manner.

It can be seen that the radiation heat shield in accordance with the present invention retains heat within the crucible and evenly distributes same during the melt period, thereby avoiding the problems enumerated above and especially providing high heat at the melt surface to drive off silicon oxides and other undesirable materials which may appear at the melt surface.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:
1. A method of melting silicon in a crucible, comprising the steps of:
   (a) providing an open top crucible having silicon therein;
   (b) covering the open top of said crucible with a heat radiation shield;
   (c) heating said silicon to provide a melt thereof in said crucible;
   (d) uncovering said crucible by an amount sufficient to allow single crystal silicon to be pulled from the crucible; and
   (e) wherein step (d) includes moving said crucible in a vertical direction to uncover said crucible by lifting said heat radiation shield.
2. A method of melting silicon in a crucible, comprising the steps of:
   (a) providing an open top crucible having silicon therein;
   (b) covering the open top of said crucible with a heat radiation shield;
   (c) heating said silicon to provide a melt thereof in said crucible;
   (d) uncovering said crucible by an amount sufficient to allow single crystal silicon to be pulled from the crucible; and
   (e) placing a seed crystal in said melt in said uncovered crucible and then pulling a single crystal of silicon from said melt.
3. The method of claim 1, further including the step of placing a seed crystal in said melt in said uncovered crucible and then pulling a single crystal of silicon from said melt.
4. A furnace for melting silicon, comprising:
   a crucible having an open top and movable in a vertical direction;
   a heater for heating said crucible positioned adjacent thereto;
   a radiation shield positioned over the open top of said crucible and covering the open top therof and pivotally movable to an open position only in re- sponse to vertical upward movement of said crucible.

5. A furnace for melting silicon, comprising:

a crucible having an open top and movable in a vertical direction;

a heater for heating said crucible positioned adjacent thereto;

a radiation shield positioned over the open top of said crucible and covering the open top thereof and pivotally movable to an open position in response to vertical upward movement of said crucible; and wherein said shield includes a plurality of segments each separately pivotally movable and having a counterweight positioned at an edge of each of said segments such that when said shield is in an open position exposing the open top of said crucible, said counterweights maintain corresponding segments in the open position and when said shield is in a closed position covering the open top of said crucible, said counterweights maintain corresponding segments in the closed position.

6. A furnace according to claim 5, wherein said segments are composed of non-silicon melt contaminating temperature reflecting material.

7. A furnace according to claim 6, wherein said segments are composed of graphite.

8. A furnace according to claim 7, wherein said segments are each composed of upper and lower layers and graphite fiber felt disposed between said layers.

9. A furnace for melting silicon, comprising:
 (a) a crucible having an open top;
 (b) a radiation heat shield positioned over the open top of said crucible and covering said open top;
 (c) means for removing said radiation heat shield from over said open top to allow single crystal silicon to be pulled from the crucible; and
 (d) wherein said means for removing said radiation heat shield includes means for moving said crucible in a vertical direction.

10. A furnace as set forth in claim 9, wherein said radiation heat shield includes a plurality of segments, the total area of said segments being equal to or greater than the area of said open top of said crucible.

11. A furnace as set forth in claim 10, wherein each of said segments is comprised of non-silicon melt contaminating, high temperature reflecting material.

* * * * *